US009093744B2

(12) United States Patent
Seal et al.

(10) Patent No.: US 9,093,744 B2

(45) Date of Patent: *Jul. 28, 2015

(54) FORWARD THROW ANTENNA UTILITY METER WITH ANTENNA MOUNTING BRACKET

(75) Inventors: Robert Bryan Seal, Meridian, MS (US); Zafarullah Khan, Kenner, LA (US); Michael Dempsey, Madison, MS (US)

(73) Assignee: ITRON, INC., Liberty Lake, WA (US)

( * ) Notice: Subject to any disclaimer, the term of this patent is extended or adjusted under 35 U.S.C. 154(b) by 880 days.

This patent is subject to a terminal disclaimer.

(21) Appl. No.: 13/336,653

(22) Filed: Dec. 23, 2011

(65) Prior Publication Data

US 2012/0098710 A1 Apr. 26, 2012

Related U.S. Application Data

(63) Continuation-in-part of application No. 11/935,089, filed on Nov. 5, 2007.

(60) Provisional application No. 60/864,201, filed on Nov. 3, 2006.

(51) Int. Cl.

| | |
|---|---|
| ***G08B 23/00*** | (2006.01) |
| ***G08C 15/06*** | (2006.01) |
| ***G01R 15/00*** | (2006.01) |
| ***H01Q 1/22*** | (2006.01) |
| ***H01Q 9/16*** | (2006.01) |

(52) U.S. Cl.

CPC ............... *H01Q 1/2233* (2013.01); *H01Q 9/16* (2013.01)

(58) Field of Classification Search

USPC .................. 340/870.02, 870.07, 870.28, 313; 702/45, 57, 60

See application file for complete search history.

(56) References Cited

U.S. PATENT DOCUMENTS

| | | | | |
|---|---|---|---|---|
| 5,621,419 | A * | 4/1997 | Meek et al. | 343/770 |
| 5,774,328 | A | 6/1998 | Rector et al. | |
| 6,115,677 | A * | 9/2000 | Perthold et al. | 702/62 |
| 6,181,294 | B1 | 1/2001 | Porter et al. | |
| 6,462,713 | B2 | 10/2002 | Porter et al. | |

(Continued)

OTHER PUBLICATIONS

Patent Cooperation Treaty, International Search Report and the Written Opinion of the International Searching Authority issued in the International Application No. PCT/US12/68077, mailed Feb. 15, 2013, 11 pages.

(Continued)

*Primary Examiner* — Firmin Backer

*Assistant Examiner* — Jerold Murphy

(74) *Attorney, Agent, or Firm* — Hanley, Flight & Zimmerman, LLC

(57) ABSTRACT

A utility meter assembly comprising: a plurality of meter components configured for measuring and collecting data, the meter components including a transceiver operative for communications over a network; a faceplate, configured such that meter reading information is displayed on the front of the faceplate; an exterior cover configured to enclose the meter components and the faceplate, wherein the faceplate is forward of the plurality of meter components; an internal dipole antenna that is situated in a space defined between the faceplate and the exterior cover toward the front of the utility meter assembly; and a mounting bracket that supports the internal dipole antenna. The combined sub-assembly of the mounting bracket and the internal dipole antenna is typically situated away from the meter components, so as to minimize interference by the meter components, and thus achieve improved communications properties measured in isotropic sensitivity and radiated power.

44 Claims, 12 Drawing Sheets

(56) References Cited

U.S. PATENT DOCUMENTS

| | | | | |
|---|---|---|---|---|
| 6,903,699 | B2 | 6/2005 | Porter et al. | |
| 7,129,900 | B2 * | 10/2006 | De Angelis | 343/719 |
| 7,453,373 | B2 * | 11/2008 | Cumeralto et al. | 340/870.02 |
| 8,188,884 | B2 * | 5/2012 | Randall et al. | 340/870.02 |
| 2006/0238426 | A1 * | 10/2006 | Savage et al. | 343/702 |
| 2006/0284784 | A1 | 12/2006 | Smith et al. | |
| 2008/0129536 | A1 | 6/2008 | Randall et al. | |
| 2011/0063172 | A1 * | 3/2011 | Podduturi | 343/700 MS |
| 2012/0293383 | A1 | 11/2012 | Randall et al. | |

OTHER PUBLICATIONS

United States Patent and Trademark Office, "Non-Final Office action" issued in connection with U.S. Appl. No. 11/935,089, mailed on Mar. 11, 2011, 18 pages.

United States Patent and Trademark Office, "Final Office action" issued in connection with U.S. Appl. No. 11/935,089, mailed on Sep. 27, 2011, 21 pages.

United States Patent and Trademark Office, "Notice of Allowance" issued in connection with U.S. Appl. No. 11/935,089, mailed on Mar. 14, 2012, 13 pages.

United States Patent and Trademark Office, "Non-Final Office action" issued in connection with U.S. Appl. No. 13/482,239, mailed on Sep. 25, 2012, 23 pages.

United States Patent and Trademark Office, "Final Office action" issued in connection with U.S. Appl. No. 13/482,239, mailed on Apr. 11, 2013, 23 pages.

Norman Smith, et al., "Under Glass Mounted Automated Meter Reader Antenna Considerations", WP Wireless, 2006, pp. 1-21; including one page Author Biographies.

* cited by examiner

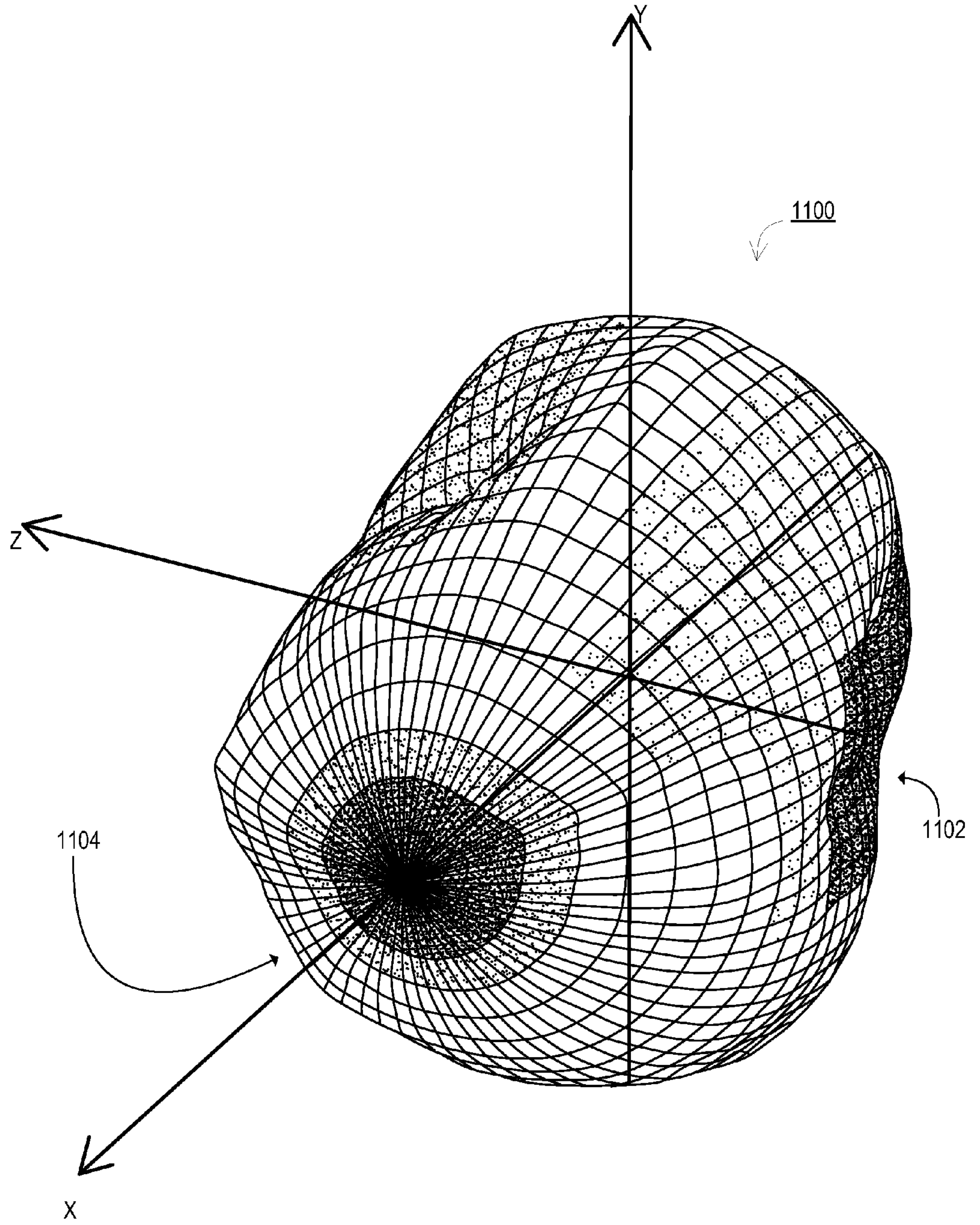
*FIG. 11* 3-D TOROIDAL RECEIVER SENSITIVITY PATTERN
A.K.A. TOTAL ISOTROPIC SENSITIVITY (TIS) PATTERN

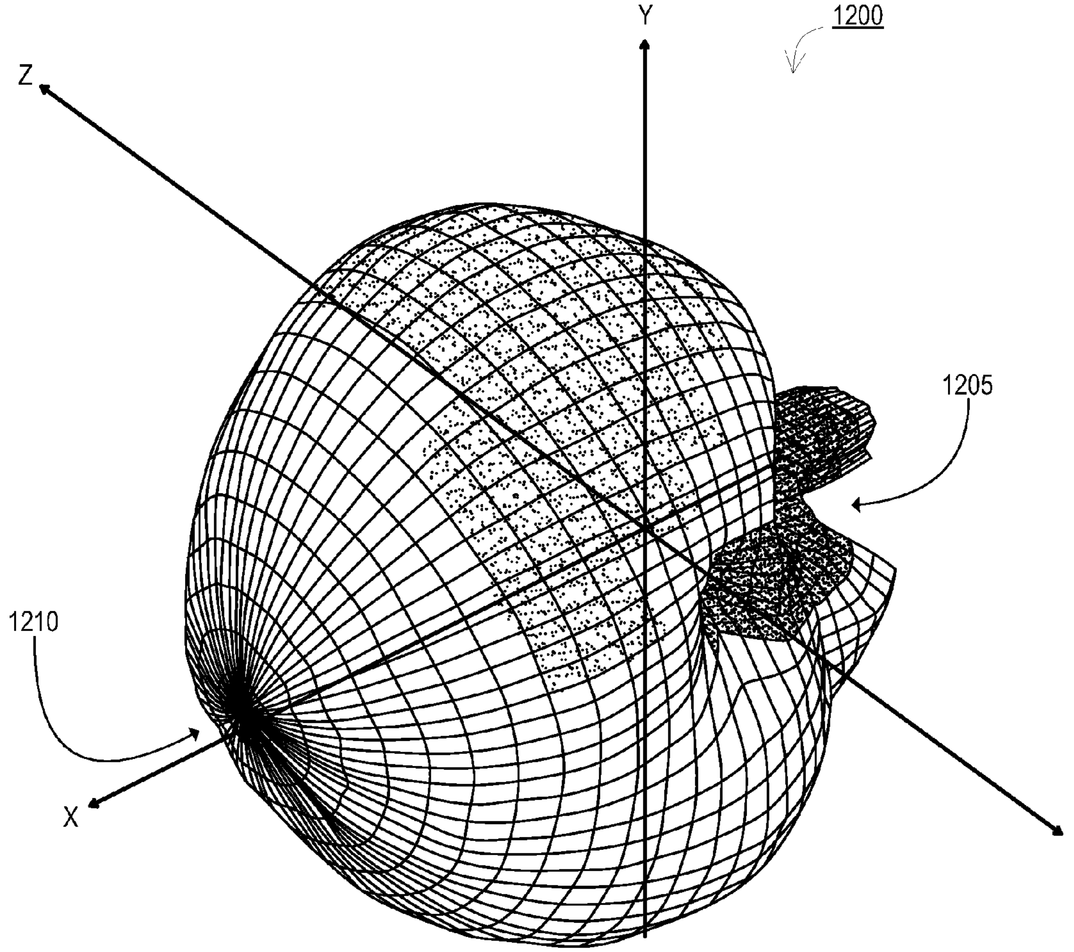
*FIG. 12* 3-D TOROIDAL PATTERN FOR TOTAL RADIATED POWER (TRP)

FORWARD THROW ANTENNA UTILITY METER WITH ANTENNA MOUNTING BRACKET

CROSS-REFERENCE TO RELATED APPLICATIONS

This application is a continuation-in-part application, and claims the benefit of and priority under 35 U.S.C. §120 to U.S. patent application Ser. No. 11/935,089 filed Nov. 5, 2007 and entitled "Forward Throw Antenna Utility Meter", which in turn claimed the benefit of and priority under 35 U.S.C. §119(e) to U.S. Provisional Patent Application No. 60/864,201, entitled "Improved Antenna Used in Electricity Metering Applications," filed Nov. 3, 2006. All of the above-referenced applications are hereby incorporated by reference as if set forth herein in their entireties.

TECHNICAL FIELD

The present invention(s) relate(s) generally to utility meters, and more particularly, to an improved utility meter assembly comprising a mounting bracket of the type adapted to support a dipole antenna used in utility meters, wherein such a utility meter assembly is designed for purposes of providing better total radiated power and total isotropic sensitivity intended for use on wireless networks.

BACKGROUND

In remote meter reading systems, such as wireless metering applications, wireless utility meters (also referred to herein as utility meter assemblies) are read without visual inspection or physical access to the meters. Wireless utility meters intended for use on wireless networks are required to undergo a certification process before they are granted carrier approval for network access. As will be commonly known, wireless networks include data networks that form a part of a wireless carrier's communication network such as, for example, VERIZON™, AT&T™, etc., among others.

Traditionally, wireless networks (specifically speaking, data networks of a wireless carrier's communication network) had certification requirements that included signaling behavior verification, which is the control protocol between the network infrastructure and the end user device. Also, network interaction was verified during both steady-state and transient conditions. However, these measurements did not characterize the over the air, radio frequency performance of communication systems. They did not convey the communication systems' sensitivity (its ability to receive low signals), that is, they did not determine how small a signal the communication systems could "hear" or receive. Further, the certification measurements did not characterize the total radiated power from the communication systems during transmission. Consequently, communication systems experienced connectivity and retransmission problems because of inadequately characterized radio frequency product performance. Unreliable connectivity, dropped calls, and data retransmission problems adversely affected the quality of service. As a result, wireless carriers shifted their focus to improving system performance and ensuring that communication systems, operating on their networks, met new over-the-air, system level requirements.

In response to increasing demand to improve wireless device performance, the United States based Cellular Telecommunications & Internet Association (CTIA) adopted more stringent, system level certification requirements relating to total isotropic sensitivity (TIS) and total radiated power (TRP). As will be understood by one skilled in the art, sensitivity and radiated power measurements reflect a system's performance in an idealized anechoic and shielded radio frequency environment. The CTIA specifies such experimental setup details (e.g., the radio frequency environment in 3D space). As will be further understood, the total isotropic sensitivity and the total radiated power are theoretical values that are weighted averages of the sensitivity and radiated power measurements.

Further, various cellular carriers (e.g., VERIZON™, AT&T™, etc.) require communication systems to meet specified values for TIS and TRP, expressed in dBm, for each frequency band that is supported by the product. In one example, AT&T™ requires communication systems operating in the 850 MHz band to meet an absolute, quantitative value of −99 dBm for the total isotropic sensitivity. Additionally, communication systems operating in the 1900 MHz band are required by AT&T™ to meet a quantitative value of −101.5 dBm for the total isotropic sensitivity. Similarly, the total radiated power value is 22 dBm for communication systems operating in the 850 MHz band and is 24.5 dBm for communication systems operating in the 1900 MHz band, as required by AT&T™. Communication systems which do not conform to these new performance requirements are not certified or granted access to the wireless carrier's network.

Utility meters, (such as, wireless electricity meters, by way of example) that access public wireless networks for remote metering purposes are an example of this communication system. Utility meters that used previous antenna designs failed to pass these new and stringent certification requirements.

One previous antenna design embedded the antenna inside the wireless electricity meter. The antenna was embedded within the communications circuit board, located inside of a dielectric housing under the meter cover, wherein the antenna conformed to the internal surface of the dielectric housing. Such designs degraded the over-the-air, system performance by introducing unintentional sources of interference such as noise coupling and signal reflection.

Other designs positioned the antenna outside of the meter cover. Such designs often draw unwanted attention to the external antenna. An external antenna positioned outside of the meter cover introduces installation and maintenance problems for the customer. Other issues include destruction of the antenna by the weather, people, or other circumstances. In addition, gains (dBm) of an external antenna are reduced due to coax cable losses that exist between the external antenna and the wireless modem device located within the wireless electricity meter. Moreover, the antenna's system level performance is adversely impacted by the presence of radiated noise emitted from electronic components and metal structures within the meter. Consequently, the uniformity of the antenna's transmit and receive patterns, the values of the total radiated power, and the values of the total isotropic sensitivity are adversely impacted.

For these and other reasons, there is a need for a system that addresses over-the-air, system level performance of wireless utility meters.

SUMMARY

The present invention(s) provide(s) systems and methods for a forward throw antenna utility meter assembly for use in remote wireless meter reading applications. One embodiment provides a utility meter assembly comprising: a plurality of meter components configured for measuring and collecting data, the meter components including a transceiver operative for signal communications over a wireless network; a faceplate, configured such that meter reading information is displayed on the front of the faceplate; an exterior cover configured to enclose meter components and the faceplate, wherein the faceplate is forward of the plurality of meter components; an internal dipole antenna that is situated in a space defined between the faceplate and the exterior cover toward the front of the utility meter assembly; and a mounting bracket that supports the internal dipole antenna. The combined sub-assembly of the mounting bracket and the internal dipole antenna is typically situated away from the meter components, so as to minimize interference by the meter components, and thus achieve improved communications properties measured in isotropic sensitivity and radiated power. The antenna is typically tuned for optimal matching impedance in exemplary 850 MHz or 1900 MHz receiving bands, so that the desired receiving band Standing Wave Ratio (SWR) is achieved, and also a specified minimum radiated power threshold is maintained.

According to one aspect, a mounting bracket that supports the internal dipole antenna is made of plastic, plastic composite material such as poly carbonates, or other similar material that are non-conductive, or are minimally conductive.

Another embodiment provides a method for assembling a utility meter comprising: selecting a plurality of meter components configured for measure and collection of data, the meter components including a transceiver operative for signal communications over a wireless network; securing a faceplate forward of the meter components; inserting an internal dipole antenna forward of the faceplate; and covering the internal dipole antenna with an exterior cover, wherein the internal dipole antenna is situated toward the front of the utility meter.

Other systems, methods, features and advantages of the present invention(s) will be or become apparent to one with skill in the art upon examination of the following drawings and detailed description. It is intended that all such additional systems, methods, features and advantages be included within this description and be within the scope of the present disclosure.

BRIEF DESCRIPTION OF THE DRAWINGS

Many aspects of the invention(s) can be better understood with reference to the following drawings. The components in the drawings are not necessarily to scale, emphasis instead being placed upon clearly illustrating the principles of the present invention(s). Moreover, in the drawings, like reference numerals designate corresponding parts throughout the several views.

FIG. 11 illustrates an exemplary toroidal three dimensional, system receive sensitivity pattern for the 850 MHz band, for a dipole antenna.

FIG. 12 illustrates an exemplary toroidal three dimensional, system level radiation pattern for the 850 MHz band, for a dipole antenna.

DETAILED DESCRIPTION OF THE EMBODIMENTS

Figure 1:
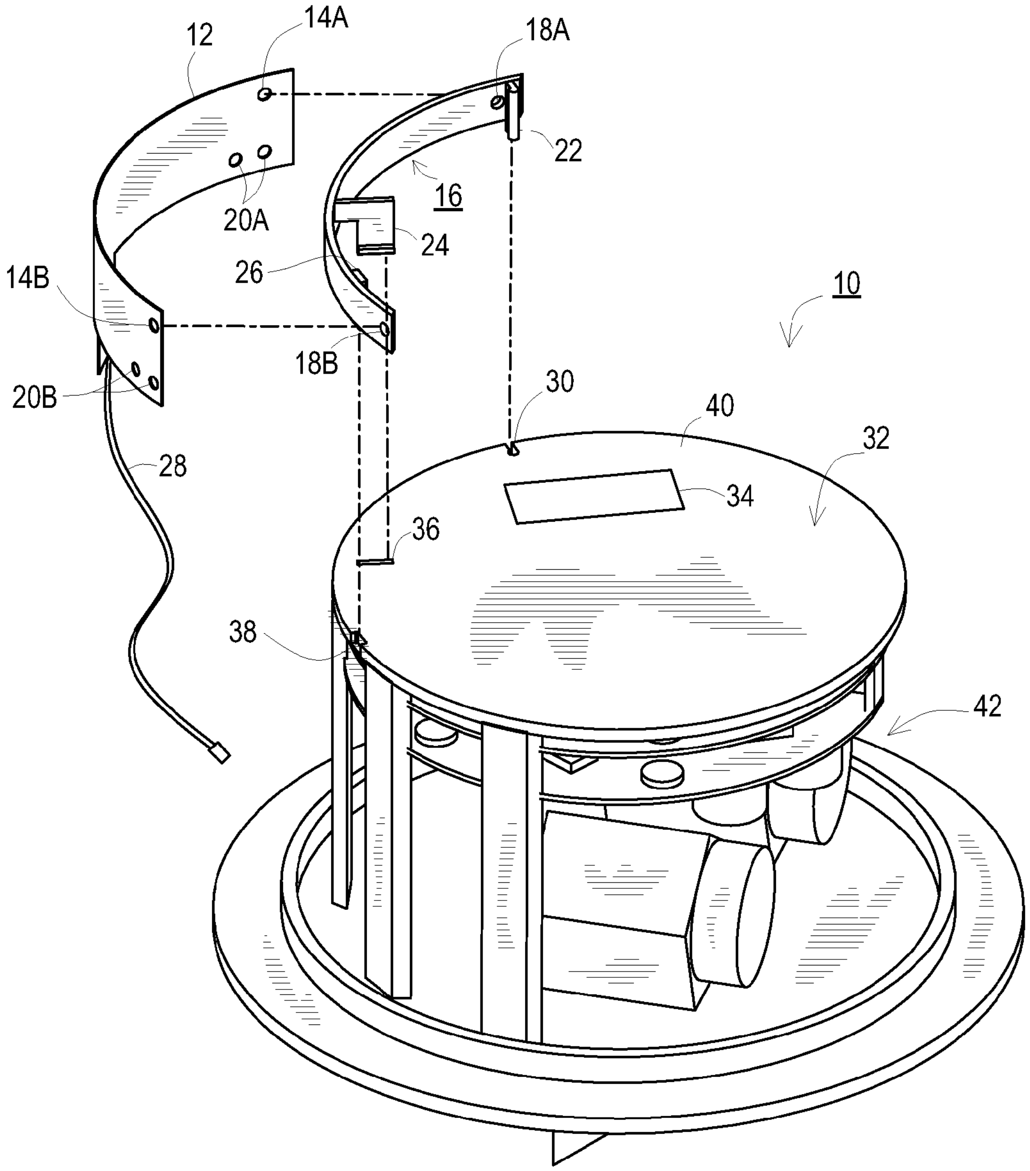
FIG. 1 is a partially exploded perspective view of a utility meter assembly comprising a sub-assembly of meter components, an internal dipole antenna, and a mounting bracket that supports the internal dipole antenna, constructed as described herein.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Turning attention to the drawings, FIG. 1 illustrates an exemplary embodiment of a utility meter assembly 10 for measuring and collecting data remotely over a wireless network, constructed in accordance with aspects of the present invention(s). Although not shown herein, it will be understood that the utility meter assembly 10 communicates bi-directionally over a wireless network with a remote monitoring station. In one embodiment, the remote monitoring station is connected to computer equipment that enables wireless communications link at the remote monitoring station. As will be understood by one skilled in the art, wireless networks (or, wireless communications links) may further comprise traditional wired networks, wireless networks, or some combination of both. For example, a communication network may include terrestrial communications networks, such as, for example, the public switch telephone network, as well as celestial communications networks. Other examples of networks include the Internet, local area networks (LAN), wide area networks (WAN), WiMax, and WiFi, or any other form of wireless network known in the art, or will be known in the future. Even further, the communication network can include data networks that form a part of a wireless carrier's communication network such as, e.g., VERIZON™, AT&T™, etc. among others.

In accordance with aspects of the invention(s), as will be described, the utility meter assembly 10 comprises an antenna 12 for facilitating RF signals to be communicated over-the-air. According to one exemplary aspect, the antenna 12 is typically a dipole antenna (e.g., arcuate-shaped as shown in FIG. 1) comprising a center-fed driven element further comprising a pair of flexible, oppositely disposed, elongate, metallic, radiating elements formed on a mounting substrate (e.g., as shown and described in FIG. 10). In one embodiment, the antenna 12, in particular, the radiating elements are operatively coupled to the wireless transceiver (not shown) via a connector 28.

As will be better understood from the discussions herein, in one aspect, the dipole antenna 12 is a forward throw antenna that is supported on top of the faceplate component 40 in a manner such that the dipole antenna 12 is configured forward of the faceplate component 40 and the internal meter components 42. According to another aspect, the faceplate component 40 provides a surface 32 for displaying meter reading identifiers such as a serial number, bar code, brand, model number, and regulatory information, among others. The plurality of meter components 42 (not shown in greater detail herein) include, for example, a wireless transceiver operative for bi-directional (full-duplex) RF communications over a network, a metering information component 34 (such as an LCD board display, or an electronic display), other electrical circuitry, metal meter structure, and other metal components as will occur to one skilled in the art.

In one embodiment of the utility meter assembly 10, the dipole antenna 12 is supported by a mounting bracket 16 that holds the dipole antenna 12 in position via a supporting element. In one example, a supporting element comprises a pair of predefined openings 14A and 14B as shown on the oppositely disposed, elongate, elements of the dipole antenna 12, more particularly on the mounting substrate of the dipole antenna 12. Accoring to one aspect, openings 14A and 14B attach with screws, rivets or other similar materials to the mounting bracket 16. Details of the dipole antenna including the mounting substrate will be discussed in connection with FIGS. 10A, 10B, and 10C. As will occur to one of ordinary skill, the openings 14A and 14B are aligned with a pair of respective predefined openings 18A and 18B on the mounting bracket 16 with the help of screws, bolts, or rivets.

Furthermore, in one embodiment, the dipole antenna 12 can have additional openings, for example 20A and 20B as shown on the oppositely disposed, elongate, elements of the dipole 12, more particularly on the mounting substrate of the dipole antenna 12. Accoring to one aspect, openings 14A and 14B attach with screws, rivets or other similar materials to the mounting bracket 16. Details of the dipole antenna including the mounting substrate will be discussed in connection with FIGS. 10A, 10B, and 10C.

It will be understood that in alternate embodiments of the utility meter assembly 10 can employ different numbers of predefined openings that are positioned differently than that shown in the disclosed embodiment. Alternately, different types of supporting element can be used, for example that e.g., adhesive taping material, glue, etc. Even further, a supporting element can also comprise deposition of copper traces on a flexible substrate such as Kapton or fiberglass (e.g., as shown in FIG. 10). Typically, in one embodiment, the mounting bracket is made of plastic, plastic composite material, or other similar material that are non-conductive, or are minimally conductive.

As will be apparent to one of ordinary skill, the mounting bracket 16 attaches to the surface 32 of the faceplate via a supporting element as will be shown and described. In one embodiment, the supporting element comprises predefined downwardly extending members 22, 24, and 26 on the bracket engageably received (as shown by dotted lines) inside predefined openings 30, 36, and 38, respectively on the surface 32 of the faceplate 40, as shown in FIG. 1. Additional details of the mounting bracket 16 and the supporting element including 22, 24, and 26 will be discussed in connection with FIGS. 5-9.

Figure 2:
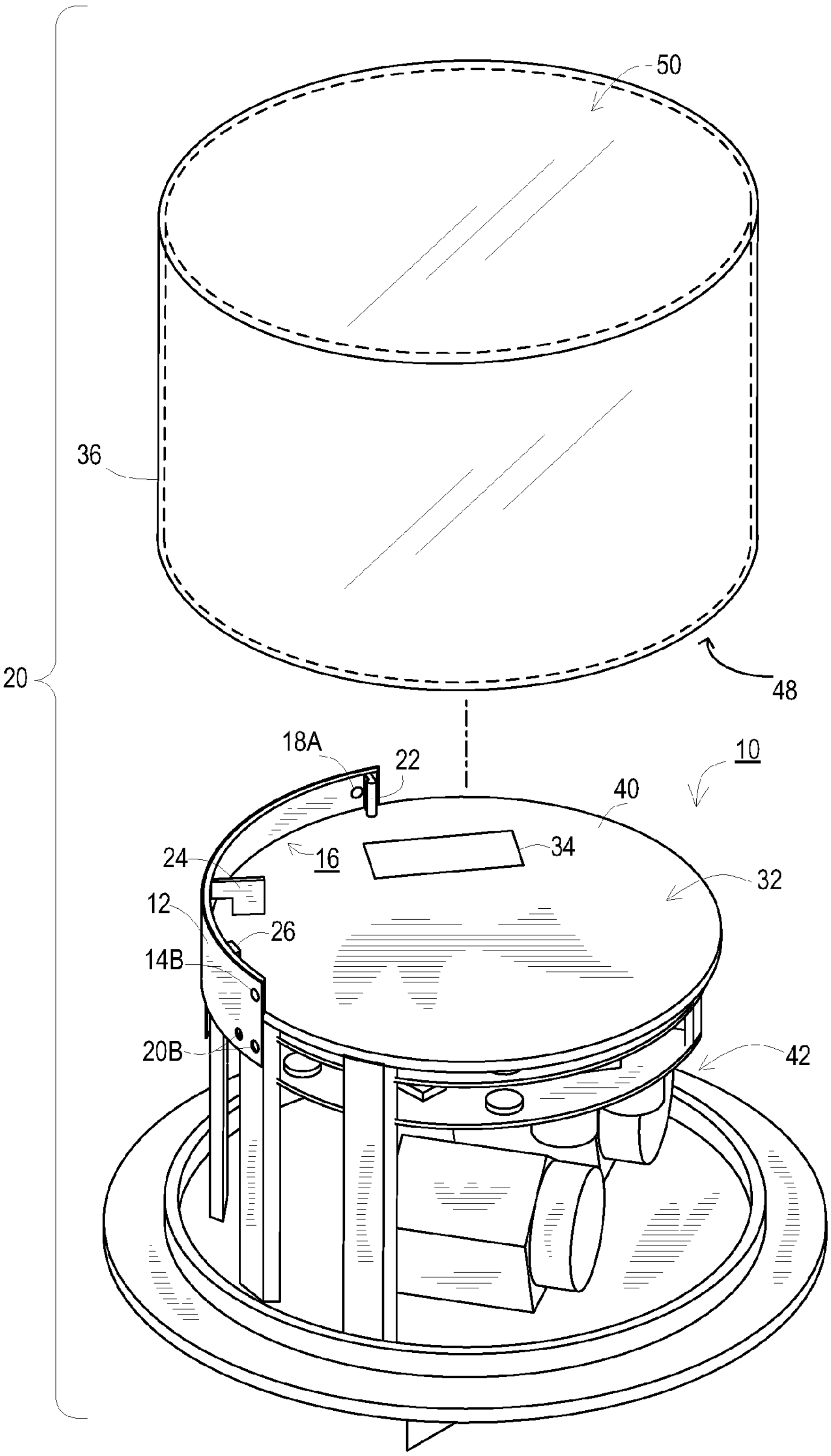
FIG. 2 is a fully exploded perspective view of a utility meter assembly, including an exterior cover.

Now turning to FIG. 2, an exploded perspective view of a utility meter 20, including an exterior cover 36. In one embodiment, the exterior meter cover 36 protects the utility meter assembly 10 from potential damages that can be inflicted by external destructive forces, such as weather, for example. Other damages can be inflicted by meter tampering, destructive objects, or other acts of destructions. The exterior cover 36 includes an open end 48 for receiving and enclosing a plurality of meter components 42 of the utility meter assembly 10 and a closed end 50, the closed end defining an inner surface and an outer surface. Although in the embodiment of the utility meter assembly 10 shown in FIG. 2, the exterior cover 36 is cylindrical in shape, in alternate embodiments, the exterior cover 36 can be frustoconical-shaped, parallelepiped-shaped, or shaped according to any other manner, as will occur to one of ordinary skill in the art. Typically, and in one embodiment, the exterior cover 36 is made of transparent material such as glass, plastics, or any other such material that is transparent to Radio Frequency (RF) signals. Further, the material of the exterior cover should be able to shield the utility meter assembly and its internal components (e.g., meter components 42, and other circuit components) from electromagnetic radiation.

As shown in FIG. 2, the utility meter assembly 10 comprises an antenna 12 that is typically a forward throw dipole antenna. It will be readily understood by those skilled in the art that other antennas could be used in the utility meter 10, such as a whip antenna, among others. In one embodiment, the antenna is an arcuate-shaped element defining a segment of a cylindrical surface, and comprising a center-fed driven element attached to a pair of flexible, oppositely disposed, elongate, metallic, flexible, deformable, radiating elements that conform to the internal shape of the exterior cover (e.g., cylindrical as shown in FIG. 2) and positioned such that the metallic elements extend into the space (shown exemplarily in FIG. 9) defined between the inner surface of the closed end 50 of the exterior cover of the utility meter assembly and forward of the surface 32 of the faceplate.

In one embodiment of the utility meter assembly 10, the faceplate component 40 encloses the internal meter components 42. The surface 32 of the faceplate component 40 is a plastic piece that is suspended in front of the internal meter components 42 and upheld by a simple supports within the utility meter assembly 10. In alternate embodiments, the faceplate is typically implemented as the front of a dedicated cover for the meter components 42, an extension of a metering information component 34 (i.e., an LCD board), or a plastic piece affixed by dedicated supports, among others. In such embodiments, the antenna 12 may be configured to be supported by the extension of a metering information component 34 and forward of the internal meter components. It should be noted that many designs can be contemplated for implementing a faceplate, and embodiments of the present disclosure will not be limited to those illustrated or discussed herein.

Typically, and as will be known by one of ordinary skill in the art, a utility meter assembly (in particular, the antenna therein) should meet system level certification thresholds, so that the utility meter assembly can be allowed to operate in a wireless network for bi-directional (full duplex) communication of metering information (meter reading information), such a communication occurring at predetermined carrier frequencies. In an exemplary environment, the antenna 12 in the utility meter assembly 10 is adapted to operate in the 850 MHz band and the 1900 MHz band. The system level certifications include specific thresholds (that are typically specified by wireless carriers) of total isotropic sensitivity (TIS)

and total radiated power (TRP) which are commonly used metrics to characterize the system-level performance of an antenna. The total isotropic sensitivity (TIS) is a weighted average of the isotropic sensitivities (i.e., isotropic sensitivity measurements). Similarly, the total radiated power (TRP) is also a weighted average of the isotropic transmitted power measurements. As will be understood, the TIS and TRP are theoretical attributes that are obtained from practical isotropic sensitivity and isotropic transmitted power measurements, wherein the isotropic sensitivity and isotropic transmitted power measurements are performed in a controlled environment.

Radiated Power measurements characterize the amount of power radiated from an antenna. Isotropic sensitivity, also referred to as receiver sensitivity, indicates the lowest signal strength the utility meter assembly 10 (in particular, the exemplary antenna 12 therein) is able to receive such that the resultant Bit Error Rate (BER) in the received signal is less than a predetermined upper limit. According to one example, such a predetermined upper limit of the BER is approximately 2.44%.

It will be understood that the dipole antenna 12 is tuned in a manner such that the utility meter assembly 10 meets the threshold requirements on TIS and TRP as mandated by various cellular carriers (e.g., VERIZON™, AT&T™). Exemplary illustrations representative of 3-dimensional patterns of TIS and TRP for a dipole antenna will be discussed in connection with FIGS. 10 and 11. In one embodiment of the present disclosure, the antenna 12 is 5.2 inches long and 0.9 inches wide. The center-fed driven element has a width of 0.725 inches and a length of 0.5 inches. Further, the antenna 12 is concealed by a DuPont™ Pyralux® FR coversheet material with a total finish thickness of 0.0178+/−10% for providing environmental protection and electrical insulation. It should be noted that other conductor shapes and materials are well within the scope of the present invention(s).

Constructed as described herein, the antenna 12, (e.g., its design and positioning with respect to the faceplate, the mounting bracket 16 for supporting the antenna 12, and various other aspects) are influential in substantially reducing exposure to unintentional (spurious) interferences that are introduced by the meter components (and other conducting components inside the utility meter 20), and even background radiation from sources external to the utility meter 20 that normally affect the reception and the transmission capability of existing antenna designs. It will be understood and appreciated that the antenna 12 in conjunction with the mounting bracket 16 provide a reliable level of improved performance, so that the utility meter assembly 10 is operative to meet system level, certification requirements including total isotropic sensitivity and total radiated power thresholds. Detailed discussions relating to total isotropic sensitivity and total radiated power will be provided in connection with FIGS. 10 and 11.

For an electricity metering system, the utility meter assembly 10 may include a variety of manufacturers and models such as Itron's CENTRON™, SENTINEL™, Elster's A3 ALPHA™, and General Electric's KV2C™ among others. Nevertheless, it will be appreciated by those skilled in the art that the present invention(s) is/are not limited to any particular meter manufacturer or model. It should also be understood that the utility meter assembly 10 may be used for water, natural gas, or other services that require metering. The utility meter assembly 10 is not merely limited to electrical meter reading.

Figure 3:
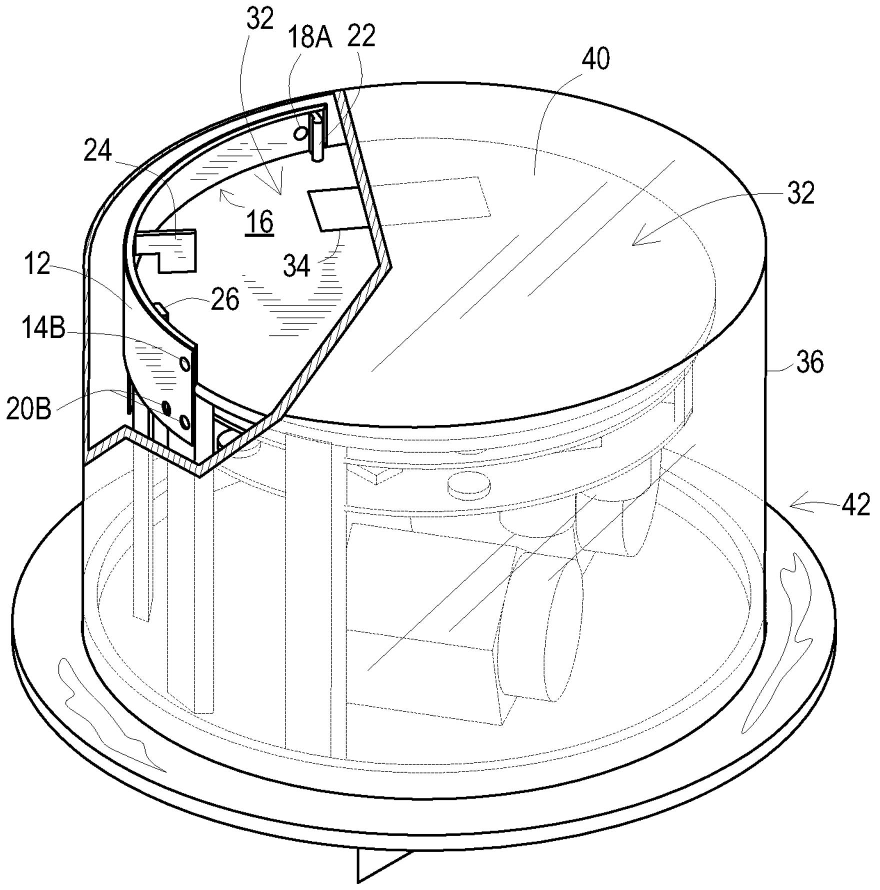
FIG. 3 is a fully assembled view of a utility meter assembly, according to aspects of the invention(s), with a section of an exterior cover partially cut away to reveal aspects of a mounting bracket.

Now referring to FIG. 3, a fully assembled view of a utility meter assembly is shown, illustrating a mounting bracket 16 as seen through a partially removed section of an exterior cover. As recited previously, and according to one embodiment, the mounting bracket 16 attaches to the faceplate component 40 via downwardly extending members 22, 24, and 26 that are engageably received (as shown by dotted lines in FIG. 1) by predefined openings on a surface 32 of the faceplate component 40. Additional descriptions of downwardly extending members 22, 24, and 26 (and the predefined openings) will be provided in connection with FIG. 4 and other figures described herein. According to one aspect, the mounting bracket 16 supports a dipole antenna 12 (typically made of some kind of conductive material) positioned forward of the faceplate component 40, wherein such an antenna is used for bi-directional communication over a wireless network with a remote monitoring station. Typically, and as will be understood, the antenna allows reception of signal from the remote monitoring station and transmission of metering information to the remote monitoring station.

Figure 4:
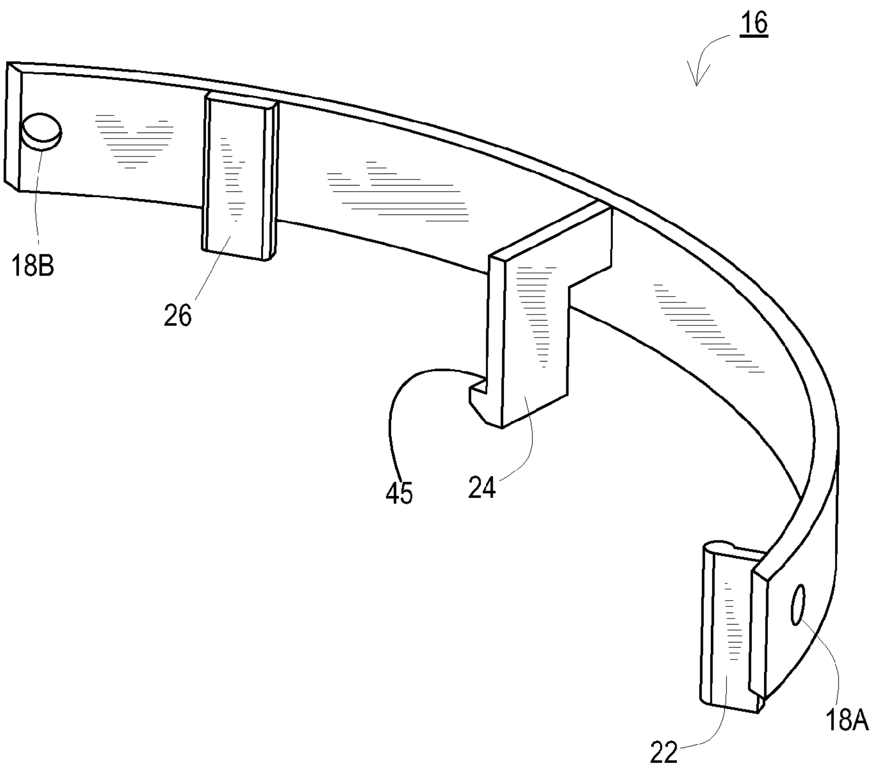
FIG. 4 is a first perspective view of a mounting bracket, according to aspects of the invention(s), showing a plurality of tabs for attaching to a faceplate.

Now referring to FIG. 4, a first perspective view of a mounting bracket 16 is shown, showing a plurality of tabs (downwardly extending from the bracket for attaching to a faceplate component). According to one embodiment, the preferred bracket 16 comprises three spaced-apart tabs 26, 24, and 22 that are downwardly extending members of predetermined lengths. As recited previously in connection with FIG. 2, in the disclosed embodiment of a utility meter assembly, a utility meter assembly comprises an exterior cover 36 that is cylindrical in shape including an open end that receives and encloses a plurality of meter components 42 of the utility meter assembly 10 and a closed end, the closed end defining an inner surface and an outer surface. Further, the open end and the closed end of a cylindrical exterior cover 36 (e.g., as shown explicitly in FIG. 2) are planar surfaces parallel to each other and having a common central vertical axis that passes through the centers of the open end and the closed end in a direction perpendicular to the closed end of the exterior cover 36.

Also, in another embodiment, the antenna 12 is an arcuate-shaped element defining a segment of a cylindrical surface, and comprising a center-fed driven element and a pair of flexible, oppositely disposed, elongate, metallic, radiating elements deformed into a shape that conforms to the internal shape of the exterior cover. Consequently, an arcuate-shaped antenna 12 (enclosed inside the cylindrical exterior cover) will share the same common vertical axis with the cylindrical exterior cover 36.

According to aspects of the present disclosure, a mounting bracket 16 supports the antenna 12. In an embodiment of the utility meter assembly comprising an arcuate-shaped antenna, the supporting mounting bracket 16 is selected to be structurally similar in shape as the arcuate-shaped antenna 12. Therefore, in such an embodiment, the mounting bracket will be arcuate-shaped, e.g., as illustrated in FIG. 4. It will be understood that an arcuate-shaped mounting bracket 16 that is structurally similar in shape as an arcuate-shaped antenna 12 will also share the same common central vertical axis (as described in the previous paragraph). In other words, it will be understood that in the disclosed embodiment the mounting bracket 16, the antenna 12, and the exterior cover 36 all share the common central vertical axis that passes through the centers of the open end and the closed end in a direction perpendicular to the closed end of the exterior cover 36. It will be further understood that the upper surface 32 of faceplate 40 in the disclosed embodiment of the utility meter assembly 10 (e.g., in FIGS. 1, 2, and 3) is circular in shape with predefined openings 38, 36, and 30 (shown in FIG. 1) for receiving, attaching, and supporting the mounting bracket 16 via members (e.g., tabs 26, 24, and 22) extending downwardly from the mounting bracket 16. Further details relating to the above-mentioned openings and members are described in what follows next.

According to one aspect, e.g., as shown in FIG. 4, a mounting bracket 16 comprises three spaced-apart tabs 26, 24, and 22 that are downwardly extending members of predetermined length. For example, tab 26 is a rectangular parallelepiped-shaped tab that extends downwardly a predetermined distance (below the segment of the cylindrical surface) in a direction parallel to the common central vertical axis so that it engages in a predefined opening (for example, opening 38 positioned very close to the circumferential edge on the upper surface 32 of the faceplate component 40 as shown in FIG. 1).

In another aspect, the mounting bracket 16 comprises a deformable L-shaped self-locking tab 24 that further includes a downwardly extending snappable member for engaging in a predefined opening (for example, opening 36 positioned on the upper surface 32 of the faceplate component 40 as shown in FIG. 1). The downwardly extending snappable member further comprises an upper catch surface 45 that engages with a lower surface (not shown herein) of the faceplate 40 in which the opening 36 is defined.

In yet another aspect, the mounting bracket 16 comprises a radially extending tab further comprising (a) a cylindrical end portion extending towards the center of the faceplate wherein the axis of the cylindrical end portion is parallel to the central vertical axis, and (b) a rectangular front portion with one dimension of the rectangular front portion extending radially inward towards the center of the faceplate wherein the axis of the cylindrical end portion is parallel to the central vertical axis, and (b) a rectangular front portion connected to the cylindrical end portion in a manner such that a first dimension of the rectangular front portion extends radially inward towards the center of the faceplate. As will be understood, the dimension parallel to the first dimension is fixed to the surface of the mounting bracket 16.

As shown in the FIG. 4 embodiment, the mounting bracket 16 comprises predefined openings 18A and 18B for supporting a dipole antenna 12 with the help of screws or bolts. It will be understood that in alternate embodiments the mounting bracket 16 can comprise different numbers of predefined openings that are positioned differently than that shown in the disclosed embodiment.

Figure 5:
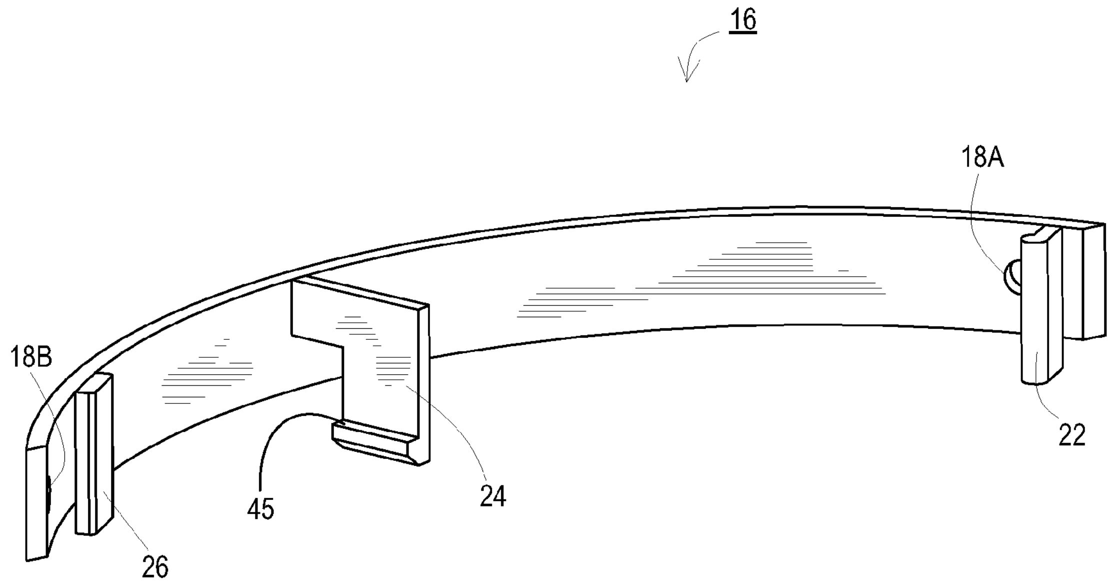
FIG. 5 is a second perspective view of the mounting bracket shown in the embodiment of FIG. 4.

Now referring to FIG. 5, a second perspective view of the mounting bracket 16 is shown as viewed from a side facing an inner surface of the mounting bracket, the inner surface further comprising a supporting element for attaching to the faceplate of the utility meter assembly. In one embodiment, the supporting element comprises tabs that are spaced apart mutually from each other and are located in an inner surface of the mounting bracket 16. Specifically shown in FIG. 5 are details of a L-shaped self-locking tab 24 that comprises a downwardly extending snappable member for engaging in a predefined opening (for example, opening 36 positioned on the upper surface 32 of the faceplate component 40 as shown in FIG. 1). The downwardly extending snappable member further comprises another protrusion having an upper catch surface 45 for engaging with a lower surface (not shown herein) of the faceplate 40 in which the opening 36 is defined.

Figure 6:
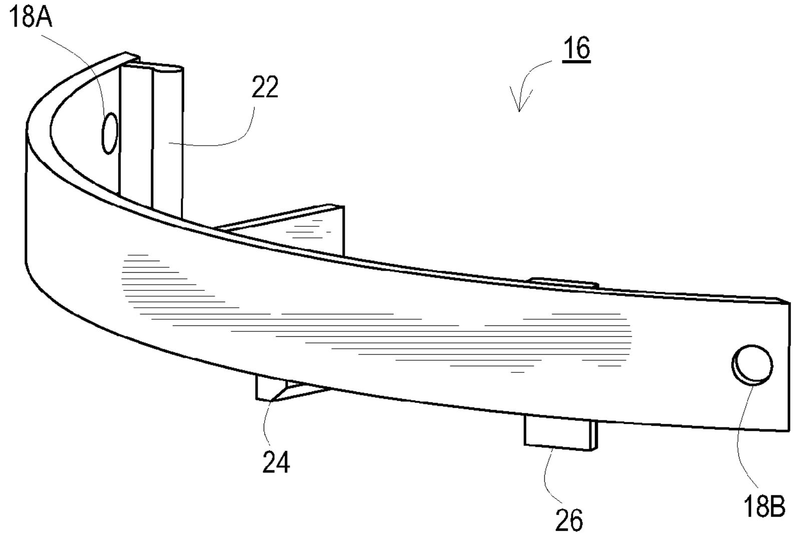
FIG. 6 is a third perspective view of the mounting bracket shown in the embodiment of FIG. 4.

Turning to FIG. 6, a third perspective view of the mounting bracket 16 is shown for inclusion inside an utility meter assembly embodiment. In particular, an outer surface of the mounting bracket 16 is illustrated in this view. It will be understood that the mounting bracket 16 will be attached to the antenna (not shown in FIG. 6) via the outer surface.

Figure 7:
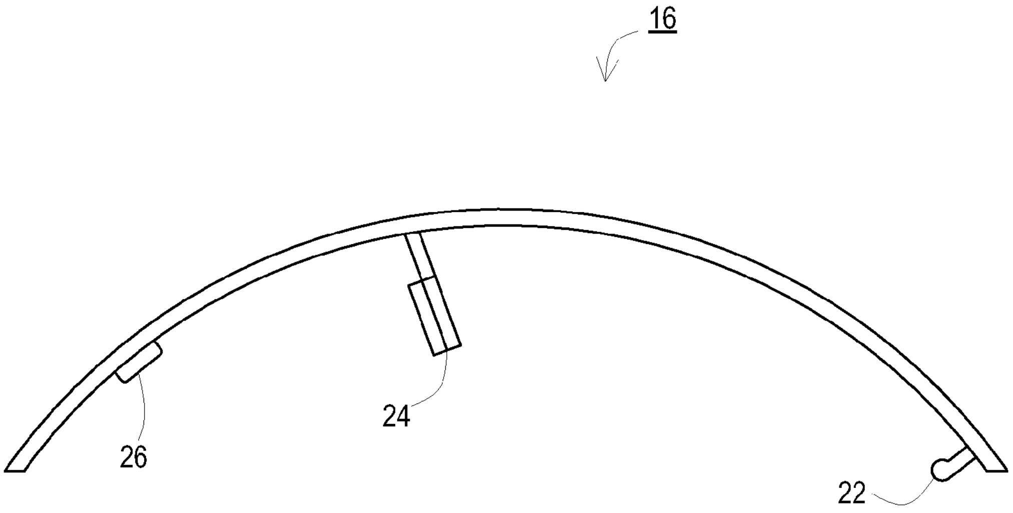
FIG. 7 is a top plan view of the mounting bracket.

Referring now to FIG. 7, a top view of a mounting bracket is shown for inclusion inside an utility meter assembly embodiment. As can be seen, and in one embodiment, the mounting bracket is arcuate-shaped with an inner surface and an outer surface, the inner surface further comprising a supporting element for attaching to the faceplate of the utility meter assembly, whereas the outer surface is for supporting and attaching to an arcuate-shaped dipole antenna (e.g., dipole antenna 12 as shown in FIG. 1). It will be apparent to one of ordinary skill in the art that alternate embodiments of the utility meter assembly no limitations are imposed on the shape of the dipole antenna and the mounting bracket. In other words, it will be understood that no correlation between the shape of the dipole antenna and the mounting bracket for supporting the antenna are implied, in the present disclosure.

An aspect of the claimed invention(s) described herein relate(s) to a mounting bracket for supporting an internal dipole antenna for use in connection with a utility meter assembly. The disclosed mounting bracket, in one embodiment, defines a segment of a cylindrical surface for supporting the internal dipole antenna and at least one supporting element for attaching to the internal dipole antenna. Another aspect relates to the combination of the mounting bracket and a flexible deformable antenna, constructed as described in detail herein.

According to yet another aspect, there is provided a method for manufacturing a utility meter assembly comprising the steps of forming at least one dipole antenna (comprising a pair of flexible, oppositely disposed, elongate, metallic, radiating elements) on the surface of a deformable, flexible, dielectric substrate; providing a mounting bracket as described herein, affixing the flexible antenna to the mounting bracket by fasteners, supporting elements, or some other suitable means; mounting the combination of the antenna and the mounting bracket on a surface of a faceplate (in the utility meter assembly) so that the metallic, radiating elements are deformed into a shape that conforms to the internal shape of an exterior cover (for the utility meter assembly); positioning the antenna such that the metallic elements extend into the space defined between the inner surface of the exterior cover of the utility meter assembly and forward of the surface of the faceplate.

Figure 8A:
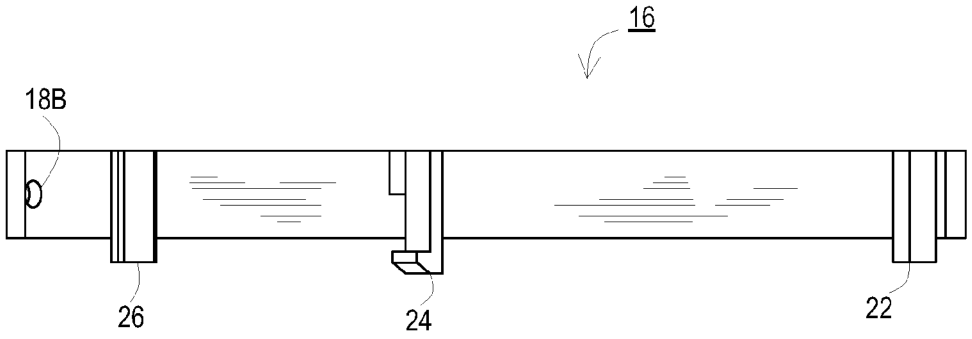
FIG. 8A is an outer plan view of the mounting bracket
Figure 8B:
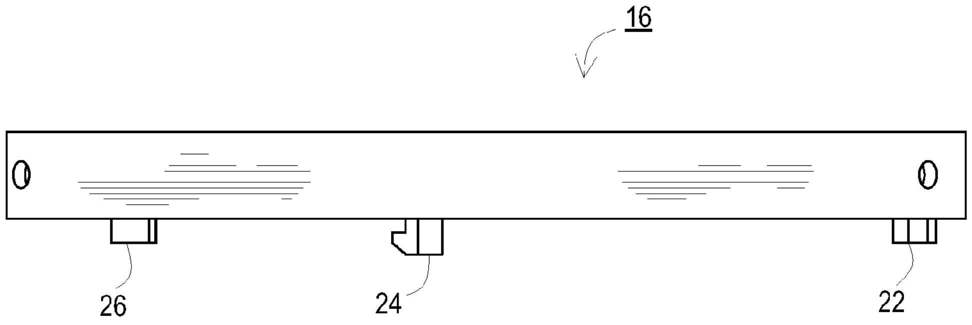
FIG. 8B is an inner plan view of the mounting bracket.

Moving on to FIG. 8 (consisting of FIG. 8A and FIG. 8B), illustrative views are shown corresponding to the inner and outer surfaces of the mounting bracket respectively. From FIG. 8B, it can be seen that the mounting bracket includes an outer surface for supporting and attaching to an arcuate-shaped dipole antenna (e.g., dipole antenna 12 as shown in FIG. 1).

As can be seen clearly in FIG. 8A, the inner surface further comprises a supporting element for attaching to the faceplate of the utility meter assembly, wherein the supporting element includes tabs 26, 24, and 22 spaced apart from each other, and downwardly extending from the inner surface of the mounting bracket. It will be understood that tabs 26, 24, and 22 are engageably received into predefined openings (e.g., openings 38, 36, and 30 as shown in FIG. 1 located on the surface of faceplate 40), for supporting the mounting bracket 16. As will be understood by those skilled in the art, these tabs are interchangeable, depending on the nature (e.g., shape, size, etc.) of the openings in surface 32 of the faceplate component. Further, no limitations are imposed on the number of tabs. An exemplary embodiment of a utility meter assembly comprising a single tab will now be described next.

Figure 9:
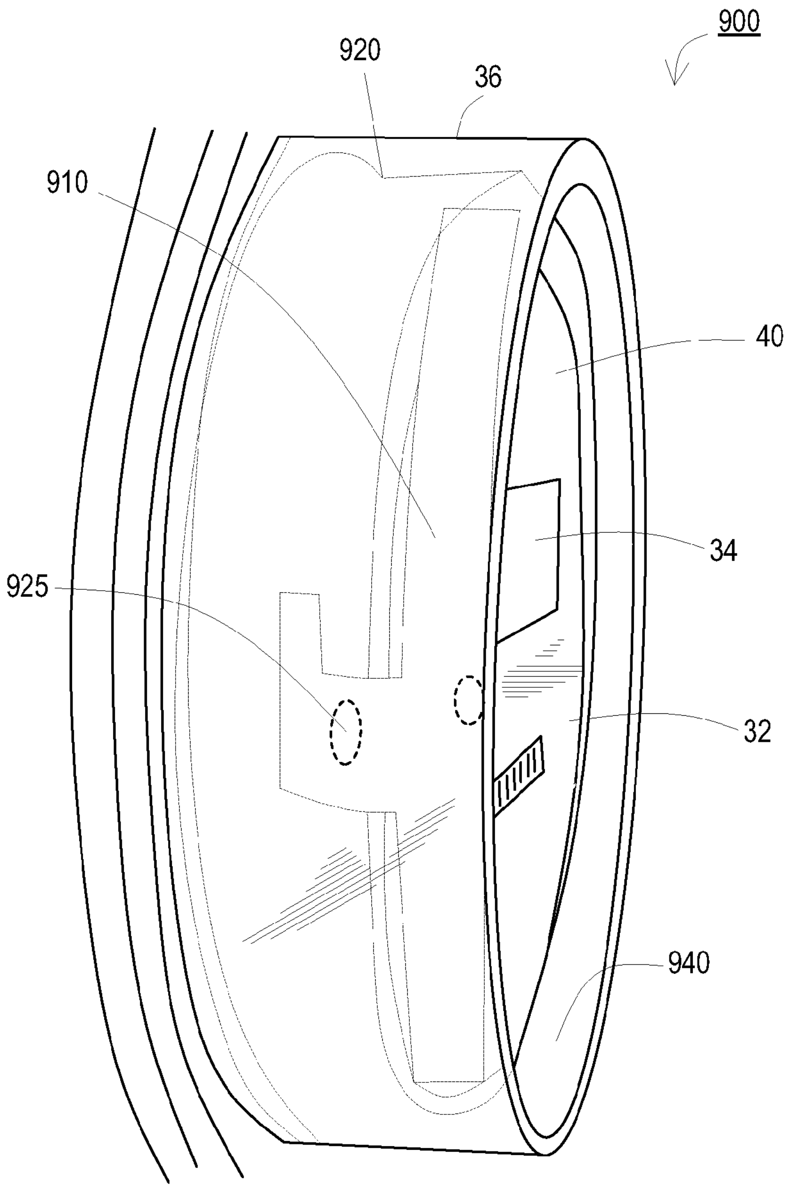
FIG. 9 illustrates a simplified side view of a utility meter assembly, according to one embodiment of the present disclosure.

FIG. 9 illustrates a simplified side view 900 of a utility meter assembly 10 having a sub-assembly 910 comprising an antenna 12 and a mounting bracket 16 (which are not visible in FIG. 9). In particular, as shown in FIG. 9, the utility meter assembly 10 comprises an exterior cover (meter cover) 36, meter components 42 (not shown), and an antenna 12 (as a part of sub-assembly 910) tuned for use in a wireless environment. In some embodiments, as shown in FIG. 9, the utility meter assembly 10 includes a secondary cover 920. The faceplate component 40 encloses the internal meter components 42 (not shown) and comprises a surface 32 for displaying metering reading identifiers (e.g., serial number, manufacturer's name, brand etc.), a metering information component 34. The sub-assembly 910 is attached to the faceplate component 40 and external to the secondary cover 920 and configured forward of the internal meter components 42 in a space 940 defined between the faceplate component 40 and the meter cover 36. If a secondary cover 920 is present, the antenna 12 (and the mounting bracket 16 supporting the antenna) can be adjoined to its exterior surface. Optionally, the secondary cover 920 also serves as a supporting member for a mechanical connection point 925, the mechanical connection point 925 being considered to be synonymous (and similar in functionality) with a tab. The connection point 925 is disposed on a portion of the surface of the secondary cover 220. The secondary cover 920 encloses and protects the meter components and serves as a supporting member to mount the sub-assembly 910 (comprising an antenna 12 and a mounting bracket 16).

In one embodiment, the antenna 12 is conformed to the curved shape of the secondary cover (if such a cover is present) 920 and is positioned forward of its mechanical connection point 925, so that it is contiguously spaced at a position forward of the front of the meter components, yet under the meter cover 36 for improved performance. Such a geometric configuration wherein the antenna 12 is positioned away from unwanted interference that originates from the electronic parts and the metal meter structure results in the antenna's improved system level performance. Details of transmit and receive radiation patterns will be discussed in connection with FIGS. 11 and 12. In what follows next, detailed descriptions of a dipole antenna will be provided.

Figure 10A:
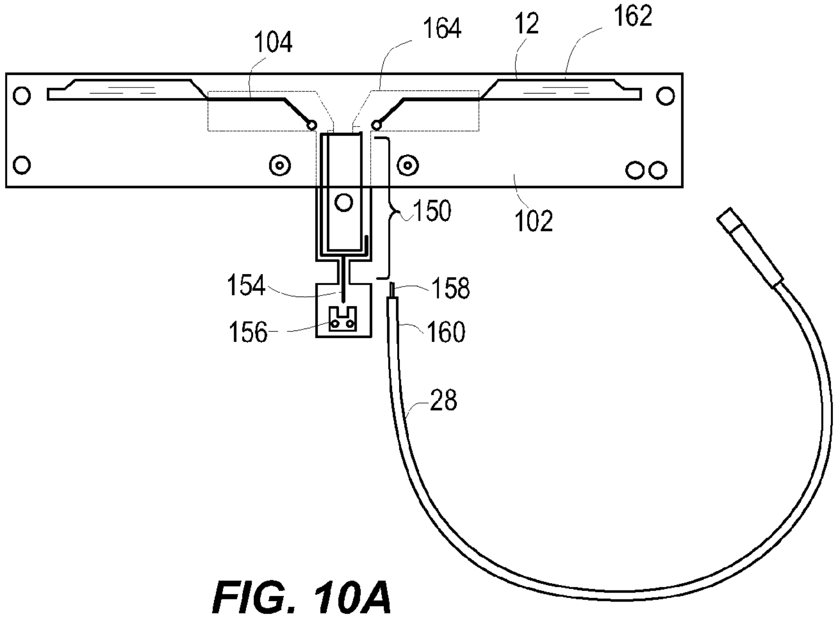
FIGS. 10A, 10B and 10C illustrate a dipole antenna, configured according to one embodiment of the present disclosure.
Figure 10B:
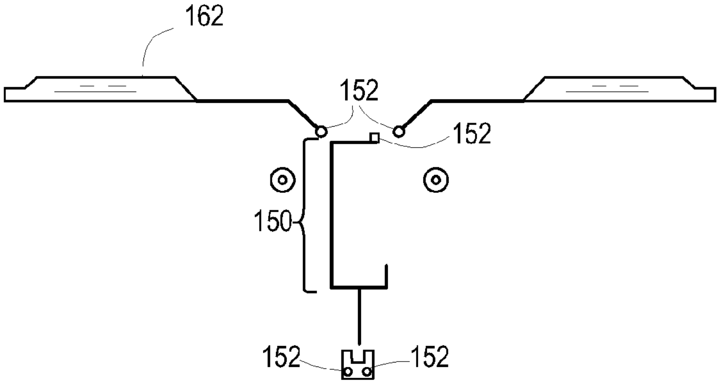
Figure 10C:
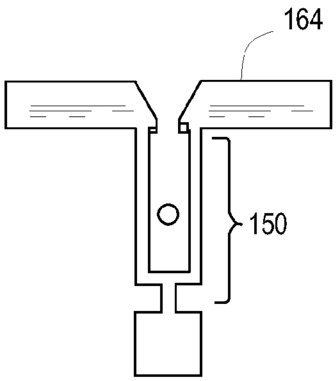

Turning to FIG. 10 (consisting of FIGS. 10A, 10B, and 10C), exemplary details of a dipole antenna are shown, according to one embodiment of the present disclosure. Specifically, in FIG. 10A, a front view of a dipole antenna 12 is shown. As will occur to one of ordinary skill in the art, a dipole antenna is usually made of metal or metal alloys, or any kind of conductive material. In the embodiment shown in FIG. 10A, a dipole antenna 12 comprising at least a center-fed driven element that further comprises a pair of flexible, oppositely disposed, elongate, metallic (generally speaking, conductive), radiating elements 104 that are operatively coupled to a transceiver (not shown) via a connector 28. The at least one center-fed element is coupled to the connector 28 via a balun 150. As will be understood, the dipole antenna allows bi-directional communication and so the at least one center-fed element is both driven (during signal transmission) by and also drive (during signal reception) the balun 150. In one aspect, the dipole antenna comprises an inner conductor pad 154 and an outer shield pad 156 that conceals vias 152. As will be understood, a via is defined as a plated through hole (PTH) in a Printed Circuit Board (PCB) that is used to provide an electrical connection between a trace on one layer of the Printed Circuit Board to a trace on another layer. Since vias are not used to mount component leads, vias generally comprise a small hole and pad diameter.

As further shown in FIG. 10A, the connector 28 is a coax cable that comprises an inner conductor 158 positioned inside a ground-referenced outer shield 160. The signal that is transmitted through the connector 28 is an unbalanced (ground-referenced) signal that needs to be conditioned into a balanced signal with the use of a balun 150. In an exemplary aspect, a dipole antenna is a dual-band antenna, for communications in the 850 MHz and 1900 MHz bands. Such a dual-band antenna can be formed, for example, by provision of two layers of copper traces on a mounting substrate, as explained next.

Now referring to FIG. 10B and FIG. 10C, respective top and bottom layers 162, 164 formed by the deposition of copper traces (on a mounting substrate) are shown as parts of a dipole antenna 12. In one aspect, the top layer 162 is longer than the bottom layer 164, the top layer being 162 tuned to operate in the 850 MHz frequency band whereas the bottom layer 164 is tuned to operate in the 1900 MHz band. As shown, the dipole antenna comprises a balun 150 for converting an unbalanced signal (received via the connector 28) into a balanced signal that can be fed into the symmetrically structured radiating elements of the dipole. It will be understood that the dipole antenna 12 is formed by the dual deposition of copper traces (or any other conductive material) in the form of a top layer (e.g., FIG. 10B) and also as a bottom layer (e.g., FIG. 10C) on a flexible mounting substrate 102 such as (but not limited to) Kapton or fiberglass. It will be further apparent to one skilled in the art that the material of the mounting substrate should be such that it does not interfere (or minimally interferes) with the transmit and receive radiation patterns of the dipole antenna.

Before proceeding further, a general synopsis is provided below to explain various aspects associated with the isotropic sensitivity a\k\a receiver sensitivity measurements. (Details of total radiated power in connection with transmit radiation pattern will be provided later herein.) A receiver sensitivity measurement (as measured at a spatial point in 3D space) indicates the lowest allowable received signal strength in a communication system (for example, an antenna 12 in the utility meter assembly 10) so that the resultant Bit Error Rate (BER) arising of decoding the received signal is less than a predetermined upper limit. According to one example, such a predetermined upper limit of the BER is approximately 2.44%. As will be understood by one skilled in the art, the total isotropic sensitivity (TIS) is a weighted average of all receiver sensitivity measurements in 3D space. As will be further understood, the experimental setup (e.g., the controlled environment etc.) of obtaining the receiver sensitivity measurements in 3D space is specified by the CTIA.

Various cellular carriers require communication systems to meet specified threshold values for TIS (and also, TRP that will be explained later), expressed in dBm, for each frequency band that is supported by a communication system. In one example, specifically, communication systems operating in the 850 MHz band are required to meet an absolute, quantitative value of −99 dBm for the total isotropic sensitivity, as required for a particular wireless carrier. In one exemplary aspect, the antenna in the present disclosure achieves a total isotropic sensitivity of approximately equal −99.52963 dBm in the 850 MHz frequency band. In another example, a particular wireless carrier requires communication systems operating in the 1900 MHz band are required to meet a threshold of −101.5 dBm for the total isotropic sensitivity. In another aspect, the antenna in the present disclosure achieves a total isotropic sensitivity of −104.290928934911 in the 1900 MHz frequency band.

It will be understood that according to aspects of the present disclosure, the antenna 12 is tuned and optimized by more closely matching the impedance in the receive bands to increase receiver sensitivity in order to meet the total isotropic sensitivity (TIS) threshold requirements. Increased sensitivity is achieved by compromising the standing wave ratio in the transmit bands, e.g., the 850 MHz and 1900 MHz frequency bands. As will be understood by one skilled in the art, the standing wave ratio characterizes the amount of power reflected back by the antenna 12 at a specific frequency across the receive bands and the transmit bands. Details of compromising the standing wave ratio in the transmit bands will be discussed later herein. In what follows, an exemplary method of performing an over-the-air test (for obtaining sensitivity and radiated power measurements) as simulated in a controlled environment will be described.

A toroidal three dimensional sensitivity pattern characterizes the receiver's system performance for the 850 MHz band is shown in FIG. 11. Such an exemplary pattern is obtained by mounting a utility meter assembly on a mechanically rotatable member overlaid on a (x y z) Cartesian coordinate system, or equivalently, a (r, theta, phi) Polar coordinate system located inside a controlled environment, e.g., within an isolated, anechoic RF chamber. (As will be understood by one skilled in the art, the manner in which measurements are performed inside a controlled environment is specified by the Cellular Telecommunications & Internet Association (CTIA).) As will be apparent to one skilled in the art, the power level of a signal that is received by the utility meter assembly is measured while rotating the rotatable member about the y and z axis, with the utility meter assembly mounted on the rotatable member. Generally, the supporting member is rotated by varying polarization angles (measured in degrees) phi and theta, as commonly named in a polar coordinate system. Typically theta represents horizontal polarization, whereas phi represents vertical polarization.

To measure sensitivity at a particular carrier frequency, the power level of a transmitting signal that is received by the utility meter assembly 10 (or, specifically the antenna 12) is varied by raising or lowering the level. The iteration of varying the power level of the transmitting signal is repeated until the decoded bit-error-rate equals the target bit-error-rate. In particular, the bit-error-rate is used to evaluate the effective receiver sensitivity at each spatial measurement location specified by the theta angle and the phi angle. When the target bit-error-rate is achieved, the power level at the meter is recorded as a receiver sensitivity data point. This is repeated at an angle every 30 degrees for both polarizations.

For example, first the supporting member (or, basically the utility meter assembly 10 and the antenna 12 located therein) is horizontally rotated around the z axis at 30 degree intervals from 0 to 360 degrees phi, while the theta angle is held constant. Similarly, next, the supporting member is vertically rotated around the y axis at 30 degree intervals from 0 to 360 degrees theta, while the phi angle is held constant. Consequently, a three dimensional sensitivity pattern characterizes the receiver's system performance for a specific frequency band is generated as shown in FIG. 11.

Referring now to FIG. 11, a toroidal three dimensional sensitivity pattern 1100 characterizes the receiver's system performance for the 850 MHz band. The pattern displays a null 1102 (more particularly, a local null) and a hot spot 1104 (more particularly, a local peak) and represents the data points that are derived locally from spatially distributed power measurements. The null 1102 conveys that the system is not sensitive to signals that fall in that particular shaded region. However, it will be understood that the local null 1102 is behind the meter and thus, does not affect system performance. More significantly, the pattern displays strong sensitivity in the hot spot 1104. The antenna 12 receives or "hears" low signals from a particular direction which correspond to the sensitivity of the antenna in that particular direction.

As recited previously, various cellular carriers require communication systems to meet specified values for TRP (in addition to requirements of TIS that were discussed above in connection with FIG. 11). Typically, requirements for TRP thresholds are expressed in dBm, for each frequency band that is supported by the communication system. The total radiated power (TRP) is a theoretical attribute that is obtained by taking a weighted average of the radiated power measurements in 3D space. Radiated power is measured by capturing data about the radiated transmit power of the utility meter assembly 10 at various locations surrounding the device, in 3D space inside a controlled environment.

In one example, the present invention(s) provide(s) a total radiated power value approximately equal to 25.73156 in the 850 MHz frequency band. For one particular wireless carrier, the TRP requirement is 24.5 dBm for communication systems operating in the 1900 MHz band. The present invention(s) provide(s) a TRP of approximately 27.082033 dBm in 1900 MHz frequency band.

In order to meet the total radiated power (TRP) threshold mandated by the various cellular carriers, the antenna 12 is optimized in a forward throw position and compromised in the 850 MHz and 1900 MHz band transmit standing wave ratio (SWR) to meet the over-the-air test for product certification. In other words, in a forward throw position, the antenna's system performance is penalized in the transmit band and thus, reducing the total power radiated by the antenna 12. While there is a reduction in radiated power, the antenna 12 is selectively tuned to allow sufficient energy transfer to the transmitter (not shown) located remotely. The standing wave ratio characterizes the amount of power reflected back by the antenna 12 at a specific frequency across the receive bands and the transmit bands. Also, the standing wave ratio conveys the impedance of the tuned antenna 12. A thorough coverage of the standing wave ratio, necessitates a discussion (that will be provided later herein) of the relationship between the standing wave ratio, reflected power, and impedance matching.

Referring now to FIG. 12, a toroidal three dimensional radiation pattern 1200 that characterizes the radiated power performance for the 850 MHz band, is shown. For obtaining the data points in the three dimensional radiation pattern that characterize the radiated power performance, the radiated power is measured using a calibrated power measurement device in a controlled environment similar to that described previously in connection with FIG. 11. These data points (spatially distributed power measurements) are captured with respect to varying theta and phi angles by sampling the radiated transmit power in free space around the meter in the test environment. Focusing on the pattern shown in FIG. 12, it can be seen that the pattern displays a hot spot 1210 (more particularly, a local hot spot) and a null 1205 (more particularly, a local null). The null 1205 indicates that the utility meter assembly 10 does not radiate effectively in this region, however, the meter is behind the null. For this reason, the system performance is not affected. More importantly, the shaded region in the hot spot 1210 displays the effective level of radiated power that is radiated while in transmit mode in a particular direction.

The radiated power and the isotropic sensitivity measurements have been represented as a three dimensional toroidal radiation pattern and a three dimensional toroidal sensitivity pattern as discussed exemplarily in connection with FIGS. 11 and 12 respectively. The patterns represent the performance of the system and echo the transmission and reception characteristics of the system.

It will be known by one sufficiently skilled in the art that TRP and TIS performances (more particularly, via the radiated power and the isotropic sensitivity measurements) are affected by meter components and other factors, such as power losses due to impedance mismatch Impedance mismatches adversely reflect power back into the source and, in turn, diminish the amount of power that is forwarded to the antenna 12 from the transmitter. Further, this mismatch diminishes the amount of energy that should be transferred to the receiver from the antenna 12. To mitigate these losses, the antenna 12 is tuned for improved performance by optimizing for the receive band sensitivity by adjusting (antenna tuning) the impedance of the antenna 12 to more closely match the impedance of the transmission line, while compromising the transmit efficiency.

Accordingly, the antenna 12 location and orientation, combined with a voltage standing wave (or, simply standing wave) characteristics (or, ratio) that optimizes the 850 MHz and 1900 MHz band receive sensitivity while comprising the 850 MHz and 1900 MHz band transmit efficiency, yields over-the-air test results that meet or exceed certification requirements. The standing wave ratio characterizes the amount of power reflected back by the antenna 12 at a specific frequency across the receive bands and the transmit bands. A thorough coverage of the standing wave ratio, necessitates a discussion (provided below herein) of the relationship between the standing wave ratio, reflected power, and impedance matching.

The standing wave ratio is a mathematical expression indicating the non-uniformity of an electromagnetic field on a transmission line, such as coaxial cable, for example. It is a stationary sinusoidal wave that measures the voltage and inherently varies sinusoidally along the length of the transmission line from the transceiver to the antenna 12. In theory, the voltage measured along the transmission line should be the same in an antenna system, in which case, the impedance of the antenna 12 is matched to the impedance of the transmission line. Hence, the sinusoidal standing waveform is non-existent in the transmission line, and a maximum power transfer takes place between the antenna 12 and the transmitter and between the antenna 12 and the receiver. When the impedance of the antenna 12 and the transmission line are matched, the voltage along the transmission line is the same. Thus, the reflected power is nominal, and consequently, the standing wave ratio is equal to one.

However, if the impedance of the antenna 12 is not matched to the impedance of the transmission line, then some of the forward power is reflected by the antenna 12, and power is transferred back toward the transceiver. Simply put, energy is reflected back to the receiver from the antenna 12, and similarly, energy is reflected back to the transmitter from the antenna 12. Hence, if the impedance of the antenna 12 and the impedance of the transmission line are not perfectly matched, then a percentage of the forward power is reflected by the antenna system. As a result, the SWR is some number greater than one.

According to aspects of the present invention(s), the antenna 12 is optimized by more closely matching the impedance in the receive bands to increase receiver sensitivity in order to meet the TIS threshold requirements. The antenna standing wave ratio values for the receive band are achieved by compromising the standing wave ratio in the transmit band. Essentially, the antenna system is penalized on the transmit band and thus, reducing the total power radiated by the antenna 12. While there is a reduction in radiated power, the antenna 12 is intentionally tuned to allow sufficient energy transfer between the antenna 12 and the transmitter. Hence, the antenna 12 provides a reliable level of performance, so that the utility meter 10 meets the total radiated power and total sensitivity thresholds.

The improved, internal antenna 12 (in conjunction with the mounting bracket 16) provides an optimal level of performance, when positioned under the meter cover and more particularly, configured forward of the meter components. The configuration is operative for providing a reliable level of performance in the communication system or the utility meter assembly 10 that undergoes the quantitative certification test for meting thresholds for total isotropic sensitivity and total radiated power. Further, the antenna system provides an acceptable level of performance for use in a public wireless communication network, and quantitatively, the level of performance being comparable to the performance of the newest cell phones available on the market today. The location and orientation of the present invention(s) correspond(s) to the successful isotropic sensitivity and radiated power measurements and is confirmed by employing the test environment, as described previously.

While the invention(s) has/have been described in terms of it embodiments, those skilled in the art will recognize that the invention(s) can be practiced and implemented with modifications within the spirit and scope of the appended claims. This particular innovation may be implemented in other wireless applications. The present invention(s) may also employ more than one antenna 12. For example, Wi-Fi applications may use two antennas. Variations using multiple antennas are well within the scope of the current invention(s).

In view of the foregoing detailed description of preferred embodiments of the present invention(s), it readily will be understood by those persons skilled in the art that the present invention(s) is/are susceptible to broad utility and application. While various aspects have been described in the context of a preferred embodiment, additional aspects, features, and methodologies of the present invention(s) will be readily discernable therefrom. Many embodiments and adaptations of the present invention(s) other than those herein described, as well as many variations, modifications, and equivalent arrangements and methodologies, will be apparent from or reasonably suggested by the present invention(s) and the foregoing description thereof, without departing from the substance or scope of the present invention(s). Furthermore, any sequence(s) and/or temporal order of steps of various processes described and claimed herein are those considered to be the best mode contemplated for carrying out the present invention(s). It should also be understood that, although steps of various processes may be shown and described as being in a preferred sequence or temporal order, the steps of any such processes are not limited to being carried out in any particular sequence or order, absent a specific indication of such to achieve a particular intended result. In most cases, the steps of such processes may be carried out in a variety of different sequences and orders, while still falling within the scope of the present invention(s). In addition, some steps may be carried out simultaneously. Accordingly, while the present invention(s) has/have been described herein in detail in relation to preferred embodiments, it is to be understood that this disclosure is only illustrative and exemplary of the present invention(s) and is made merely for purposes of providing a full and enabling disclosure of the invention(s). The foregoing disclosure is not intended nor is to be construed to limit the present invention(s) or otherwise to exclude any such other embodiments, adaptations, variations, modifications and equivalent arrangements, the present invention(s) being limited only by the claims appended hereto and the equivalents thereof.

The invention claimed is:

1. A utility meter assembly comprising:

an exterior cover including an open end for receiving and enclosing a plurality of meter components of the utility meter assembly and a closed end, the closed end defining an inner surface and an outer surface;

the plurality of meter components housed within the exterior cover and operative for measuring and collecting data, the plurality of meter components including a transceiver operative for signal communications over a network and a metering information component;

a faceplate providing a surface for the metering information component and disposed a distance from the inner surface of the exterior cover, thereby defining a space between the inner surface of the exterior cover of the utility meter assembly and the faceplate, and further the surface of the faceplate containing an opening;

an internal dipole antenna comprising a center-fed driven element further comprising a pair of flexible, oppositely disposed, elongate, metallic, radiating elements deformed into a shape that conforms to an internal shape of the exterior cover and positioned such that the metallic elements extend into the space defined between the inner surface of the exterior cover of the utility meter assembly and forward of the surface of the faceplate, the radiating elements of the dipole antenna being operatively coupled to the transceiver; and a mounting bracket comprising an arcuate-shaped element defining a segment of a cylindrical surface for supporting the internal dipole antenna and positioned such that the mounting bracket extends into the space defined between the inner surface of the exterior cover of the utility meter assembly and forward of the surface of the faceplate, the bracket comprising at least at least one downwardly extending member of a length that is received by the opening on the surface of the faceplate thereby attaching the bracket to the surface of the faceplate.

2. The utility meter assembly of claim 1, wherein the faceplate is a front of an inner cover, the inner cover to enclose the plurality of meter components.

3. The utility meter assembly of claim 1, wherein the meter components include a metering information component.

4. The utility meter assembly of claim 3, wherein the faceplate is substantially coplanar with the metering information component.

5. The utility meter assembly of claim 3, wherein the metering information component is an electronic display.

6. The utility meter assembly of claim 1, further comprising a connection point on the faceplate for securing the internal dipole antenna to the faceplate.

7. The utility meter assembly of claim 1, wherein the exterior cover is cylindrical.

8. The utility meter assembly of claim 7, wherein the internal dipole antenna is conformed to a curved shape of the cylindrical exterior cover.

9. The utility meter assembly of claim 1, wherein the internal dipole antenna is a first dipole antenna, and further comprising a second dipole antenna positioned generally parallel to the first dipole antenna.

10. The utility meter assembly of claim 9, wherein first dipole antenna is to be tuned to a first frequency band and the second dipole antenna is to be tuned to a second frequency band.

11. The utility meter assembly of claim 1, wherein the utility meter assembly is configured for measuring and collecting data related to at least one of: electrical power, natural gas, or water.

12. The utility meter assembly of claim 1, wherein the internal dipole antenna is concealed by a coversheet material, the coversheet material configured for providing environmental protection and electrical insulation.

13. The utility meter assembly of claim 1, further comprising a secondary cover that encloses the faceplate and the plurality of meter components, and further wherein the dipole antenna is mounted on the secondary cover.

14. The utility meter assembly of claim 1, wherein the open end and the closed end of the exterior cover are planar surfaces substantially parallel to each other and having a common central vertical axis that passes through the centers of the open end and the closed end in a direction substantially perpendicular to the closed end of the exterior cover.

15. The utility meter assembly of claim 14, wherein the at least one downwardly extending member of a length is comprises (i) a tab that extends a distance in a direction substantially parallel to the central vertical axis so that the tab engages in the opening on the surface of the faceplate, (ii) a deformable self-locking tab that includes a downwardly extending snappable member that engages in the opening on the surface of the faceplate, or (iii) a radially extending tab further comprising (a) a cylindrical end portion extending towards the center of the faceplate, wherein the axis of the cylindrical end portion is substantially parallel to the central vertical axis, and (b) a rectangular front portion extending radially inward towards the center of the faceplate.

16. The utility meter assembly of claim 1, wherein the exterior cover is cylindrical in shape.

17. The utility meter assembly of claim 16, wherein the arcuate-shaped element of the mounting bracket has a radius of curvature that is substantially similar to the radius of curvature of the cylindrical exterior cover.

18. The utility meter assembly of claim 1, wherein the faceplate is circular in shape.

19. The utility meter assembly of claim 18, wherein the mounting bracket is positioned on a circumference of the faceplate in a direction along a radius of the circular faceplate.

20. A utility meter assembly comprising:

an exterior cover including an open end for receiving and enclosing a plurality of meter components of the utility meter assembly and a closed end, the closed end defining an inner surface and an outer surface;

the plurality of meter components housed within the exterior cover;

a faceplate providing a surface for a metering information component and disposed a distance from the inner surface of the exterior cover, thereby defining a space between the inner surface of the exterior cover of the utility meter assembly and the surface of the faceplate, the surface of the faceplate further supporting a mounting bracket via a first supporting element;

a mounting bracket having an inner surface and an outer surface and positioned such that the mounting bracket extends into the space, the bracket attaching to the surface of the faceplate via the first supporting element; and an internal dipole antenna comprising a center-fed driven element further comprising a pair of flexible, deformable, metallic, radiating elements and positioned such that the metallic elements extend into the space, the dipole antenna being held in position by the mounting bracket via a second supporting element.

21. The utility meter assembly of claim 20, wherein the first supporting element comprises fastening screws or bolts retained by openings on the mounting bracket.

22. The utility meter assembly of claim 20, wherein the first supporting element comprises adhesive taping material and glue.

23. The utility meter assembly of claim 20, wherein the second supporting element is affixed to the inner surface of the bracket and further comprises (i) at least one member of a length downwardly extending from the mounting bracket (ii) the opening on the surface of the faceplate, wherein the at least one member is received by the opening.

24. The utility meter assembly of claim 23, wherein the at least one downwardly extending member is made of plastic, plastic composite material, or poly carbonate material.

25. The utility meter assembly of claim 20, wherein the outer surface of the mounting bracket is deformable so as to conform to a shape of an inner surface of the exterior cover.

26. The utility meter assembly of claim 20, wherein the mounting bracket is arcuate-shaped element defining a segment of a cylindrical surface.

27. The utility meter assembly of claim 20, wherein the faceplate is circular in shape.

28. The utility meter assembly of claim 27, wherein the mounting bracket is an arcuate-shaped element defining a segment of a cylindrical surface, the mounting bracket having a radius of curvature that is substantially similar to the radius of curvature of the cylindrical exterior cover.

29. The utility meter assembly of claim 27, wherein the mounting bracket is positioned on a circumference of the faceplate in a direction along a radius of the circular faceplate.

30. The utility meter assembly of claim 20, wherein the exterior cover is cylindrical in shape.

31. The utility meter assembly of claim 20, wherein the radiating elements of the dipole antenna are formed by depositing conductive material on a non-conducting mounting substrate.

32. The utility meter assembly of claim 31, wherein the material of the mounting substrate comprises plastic, fiberglass, or Kapton.

33. The utility meter assembly of claim 31, wherein the conductive material is copper.

34. The utility meter assembly of claim 20, wherein the mounting bracket is constituted from a single element.

35. The utility meter assembly of claim 20, wherein the mounting bracket is constituted from a combination of elements assembled together.

36. The utility meter assembly of claim 20, wherein the mounting bracket is made of plastic, plastic composite material, or poly carbonate material.

37. The utility meter assembly of claim 20, wherein the second supporting element comprises adhesive taping material and glue.

38. A mounting bracket for supporting an internal dipole antenna for use in connection with a utility meter assembly that includes a faceplate for displaying meter reading information, the faceplate disposed a distance from an inner surface of an exterior cover of the utility meter assembly, thereby defining a space between the inner surface of the exterior cover of the utility meter assembly and a first surface of the faceplate, the faceplate further including an opening on the first surface, the mounting bracket comprising:

an outer surface and an inner surface, the outer surface supporting the internal dipole antenna by a supporting element; and at least one attachment member of a length extending from the inner surface of the mounting bracket that is received by the opening on the first surface of the faceplate, thereby attaching the mounting bracket to the first surface of the faceplate, whereby the internal dipole antenna is positioned in the space between the inner surface of the exterior cover of the utility meter assembly and the first surface of the faceplate.

39. The mounting bracket of claim 38, wherein the at least one attachment member of a length that comprises the mounted bracket that includes (i) a partially deformable tab that extends a distance in a direction substantially perpendicular to the first surface of the faceplate such that the tab engages in the opening on the first surface of the faceplate, (ii) a deformable self-locking tab that includes a downwardly extending snappable member that engages in the opening on the first surface of the faceplate, or (iii) a radially extending tab further comprising (a) a cylindrical end portion extending towards the center of the faceplate wherein the axis of the cylindrical end portion is substantially perpendicular to the first surface of the faceplate, and (b) a rectangular front portion with one dimension of the rectangular front portion extending inwardly towards the center of the faceplate.

40. The mounting bracket of claim 38, wherein the supporting element comprises fastening screws or bolts retained by openings on the mounting bracket.

41. The mounting bracket of claim 38, wherein the supporting element comprises adhesive taping material and glue.

42. The mounting bracket of claim 38, wherein the mounting bracket is made of plastic, plastic composite material, or poly carbonate material.

43. The mounting bracket of claim 38, wherein the at least one downwardly extending member is made of plastic, plastic composite material, or poly carbonate material.

44. The mounting bracket of claim 38, wherein the mounting bracket is constituted from a single element.

* * * * *

UNITED STATES PATENT AND TRADEMARK OFFICE

CERTIFICATE OF CORRECTION

PATENT NO. : 9,093,744 B2
APPLICATION NO. : 13/336653
DATED : July 28, 2015
INVENTOR(S) : Robert Bryan Seal et al.

It is certified that error appears in the above-identified patent and that said Letters Patent is hereby corrected as shown below:

In the Claims,

Column 17, Line 36 (Claim 1): Delete "at least" after "comprising"

Column 18, line 21 (Claim 15): Delete "is" after "length"

Signed and Sealed this
Sixteenth Day of August, 2016

Michelle K. Lee
*Director of the United States Patent and Trademark Office*